United States Patent [19]

Pradal et al.

[11] 4,088,968

[45] May 9, 1978

[54] FREQUENCY LINEARIZATION AND SENSITIVITY EQUALIZATION OF A FREQUENCY MODULATED CRYSTAL OSCILLATOR

[75] Inventors: Bortolo Mario Pradal; Paul Lawrence Buess, both of Pittsburgh, Pa.

[73] Assignee: RCA Corporation, New York, N.Y.

[21] Appl. No.: 803,225

[22] Filed: Jun. 3, 1977

[30] Foreign Application Priority Data

Nov. 8, 1976 United Kingdom .............. 46461/76

[51] Int. Cl.² .............................................. H03C 3/22
[52] U.S. Cl. ................................. 332/26; 331/116 R; 331/177 V; 332/16 T; 332/30 V
[58] Field of Search .................... 332/16 T, 26, 30 V; 331/116 R, 117 V

[56] References Cited

U.S. PATENT DOCUMENTS

| | | | |
|---|---|---|---|
| 3,631,364 | 12/1971 | Schilb et al. ........................... | 332/26 |
| 4,001,724 | 1/1977 | Keller .................................... | 332/26 |

*Primary Examiner*—Siegfried H. Grimm
*Attorney, Agent, or Firm*—Eugene M. Whitacre; Paul J. Rasmussen; Robert L. Troike

[57] ABSTRACT

A direct FM modulator includes an oscillator comprising a current conducting device providing amplification to sustain oscillations and a frequency determining circuit connected thereto for controlling the frequency of oscillation. The frequency determining circuit includes a piezoelectric element in series with a voltage variable capacitance and an adjustable capacitance coupled across this series combination. The capacitance of the voltage variable capacitance is changed by a modulating voltage to provide frequency deviation about the center frequency of oscillation. A frequency linearization of the crystal oscillator is provided by a selected value of capacitance coupled across the varactor and the capacitance value of the adjustable capacitance such that the frequency deviation vs. voltage is maximum at the initial reference bias voltage and is symmetrical about this reference bias.

7 Claims, 7 Drawing Figures

FREQUENCY LINEARIZATION AND SENSITIVITY EQUALIZATION OF A FREQUENCY MODULATED CRYSTAL OSCILLATOR

BACKGROUND OF THE INVENTION

This invention relates to frequency modulated oscillators. Present art direct frequency modulated crystal oscillators using variable capacitance diodes can be divided in two main categories or types. The term, "direct frequency modulated crystal oscillator" refers to that type of modulation frequency with or without temperature compensation where the direct frequency modulation is obtained by applying a modulating signal, such as an audio signal, to a voltage variable capacitance diode (varicap) biased by a fixed D.C. voltage network.

In a first type of modulated crystal oscillator the required system frequency deviation is obtained by further multiplication of oscillator frequency deviation, usually by a factor of nine to 36 times. In this type of system, the total frequency excursion due to FM modulation is a fraction of the spacing between the zero and the pole frequencies of the crystal.

In the second type of system, the oscillator is also modulated in frequency by applying the audio signal to a D.C. biased voltage variable capacitance diode, but the total system frequency deviation is obtained directly without further multiplication from the crystal oscillator. In land mobile radio applications, the system peak frequency deviation is limited to 5 KHz above and below the transmitter carrier frequency that span, at present in the U.S., the frequency range of 25 to 512 MHz. Because a total of 10 kHz excursion of the crystal frequency is too large a portion of the crystal pole-zero frequencies spacing, the oscillator frequency deviation vs. modulating signal amplitude characteristic becomes non-linear with consequent increase of distortion of the recovered audio signal. The linearity is improved and the frequency deviation for a given modulating signal amplitude is increased if an inductor is inserted in series with the crystal and the feedback capacitances of the circuit.

Analysis of such circuit shows that the inductor improves the linearity of the oscillator characteristic of frequency deviation versus modulation voltage amplitude, permits small adjustment of the crystal output frequency to offset manufacturing crystal calibration and aging tolerance, and increases the frequency deviation sensitivity (the oscillator frequency output excursion for a given modulating voltage amplitude).

These three functions are interdependent; therefore, the adjustment of the inductance value that improves the linearity and the distortion most of the time does not always coincide with the required value necessary to set the frequency or to obtain the desired constant sensitivity necessary. This is especially true in multifrequency applications when driven by the same audio signal source. The usual solution to these problems is invariably a compromise; i.e., the inductor is adjusted for the value that permits the setting of the frequency by compensating for the overall feedback capacitance and manufacturing crystal tolerances, and in the process offers a value that somewhat improves the linearity. The characteristic that the compromise sacrifices is the ability to set the frequency deviation sensitivity precisely in multifrequencies applications. In the latter case, the equalization of the frequency deviation in a given frequency range is obtained by applying the audio signal through an adjustable potentiometer that can set a voltage different in amplitude for each oscillator in order to compensate or equalize different oscillator frequency deviation sensitivities.

The disadvantages of the prior art type of circuit are the following:

1. It requires a potentiometer for each frequency channel element to equalize the different frequency deviation sensitivities of each individual channel oscillator.

2. It requires an inductor of low Q in series with the frequency determining elements of the crystal network and therefore the noise and frequency stability are now dependent also on the stability of the inductor characteristics.

Usually both noise and frequency stability are degraded with respect to those of the crystal and feedback stable capacitors alone. The degradation is proportional to the amount the crystal series resonance frequency is shifted down by the inductor value. Since this value is unique for a given frequency and linearity improvement, no minimization of this effect is possible without affecting the demodulated signal distortion.

3. A certain degree of instability and/or frequency jumping exists, created by the inductor-generated new reactance zero above the crystal pole frequency where usually large crystal spurious frequencies can produce unwanted oscillation, either crystal or non-crystal controlled.

4. The slope of the frequency deviation versus the modulating voltage $V_D$ is not constant, as it ideally should be, but has a constant negative slope which gives different frequency deviations for equal negative or positive going modulating signal, a phenomenon called frequency deviation asymmetry. This lack of symmetry between positive and negative going frequency excursions when driven by symmetrical modulating input is the most serious drawback of the prior art approaches. Another limitation is that when a frequency-temperature compensation voltage is to be applied directly at the modulating element, it affects the symmetry and the sensitivity of the frequency deviation. The latter is a very important characteristic when the oscillator should be compensated to frequency stability of better than $\pm$ 2 ppm in the temperature range of $-40°$ to $+80°$ C.

SUMMARY OF THE INVENTION

A frequency modulated crystal controlled oscillator is provided which includes a current conducting amplifying device and a frequency determining circuit connected thereto for controlling the frequency of oscillations. The frequency determining circuit includes a crystal element resonant at a frequency dependent upon a reactance in series therewith. The modulation of the oscillator is provided by a voltage variable capacitance connected in series with the crystal element. An initial DC reference bias is applied across said voltage variable capacitance for setting the center frequency of oscillation. The improvement to achieve linearity is achieved by a second capacitance connected across the series combination of the voltage variable capacitance and the crystal element and a third capacitance across the voltage variable capacitance where the value of the third capacitance and the second capacitance is selected to provide a frequency deviation versus voltage that is generally symmetrical about the initial D.C. reference bias.

DESCRIPTION OF THE INVENTION

Figure 1:
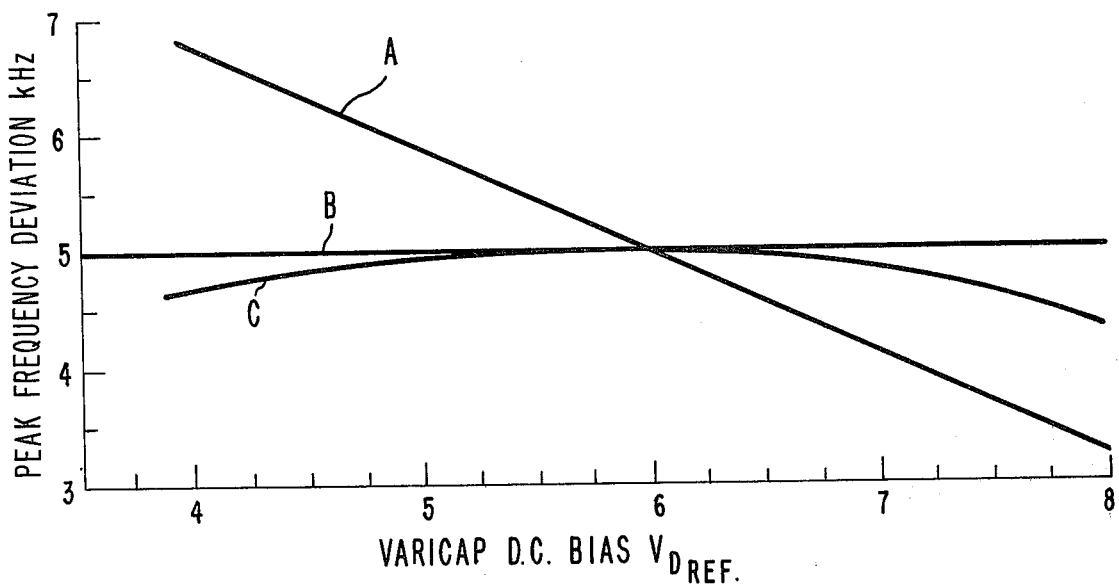
FIG. 1 is a plot of peak frequency deviation for a constant modulating signal amplitude versus varicap DC bias voltage.

Referring to FIG. 1, curve A illustrates the present art peak frequency deviation for a fixed modulating signal amplitude versus the varicap DC bias. If the D.C. voltage in the present art deviation schemes should change ±0.5 volts to compensate for the crystal temperature drift, this D.C. voltage change would cause an increase or decrease in the frequency deviation of about ±400 Hz producing an 800 Hz asymmetrical error. If the characteristic above had a constant slope as curve B of FIG. 1, the peak frequency deviation would be independent of the varicap DC bias variation necessary for oscillator temperature compensation. Curve C illustrates the peak frequency deviation versus voltage characteristic resulting from the circuit described herein.

Figure 2:
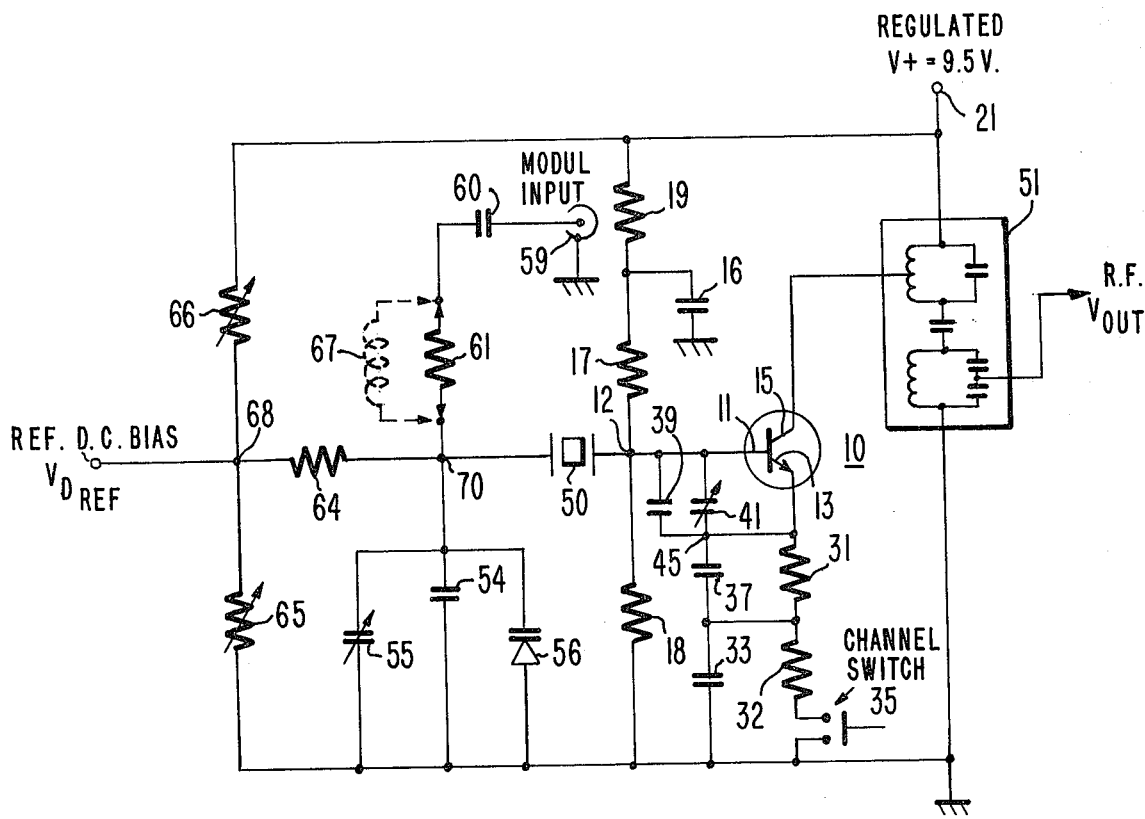
FIG. 2 is a schematic diagram of a frequency modulated crystal oscillator according to one embodiment of the present invention.

Referring to FIG. 2, there is illustrated a schematic diagram of the frequency modulated crystal oscillator of the present invention. The circuit includes an NPN transistor 10 having a base electrode 11, emitter electrode 13 and collector electrode 15. The D.C. bias for the base 11 is provided via voltage dividing network of resistors 17, 18 and 19 with resistor 19 connected to a regulated power supply at terminal 21 and resistor 18 connected to ground. The junction point 12 of resistors 17 and 18 are connected to the base 11 of transistor 10. The bypass of the power supply is provided by capacitor 16. When the oscillator is to be switched on, resistor 32 is connected to ground via switch 35. RF bypass of resistor 32 is provided by capacitor 33. Capacitor 37 is coupled across resistor 31 with one terminal connected to the emitter 13 of transistor 10 and the opposite terminal connected to the junction of resistors 31 and 32. Fixed capacitor 39 and variable capacitor 41 are coupled in parallel across the base-emitter junction of transistor 10 and these parallel capacitors are connected in series with capacitor 37 to form a voltage dividing capacitor network with the junction 45 of the parallel connected capacitors 39 and 41 and capacitor 37 being coupled to emitter 13 to provide what is sometimes referred to as a modified Colpitts circuit. The value of resistor 31 and the value of capacitors 39, 41 and 37 determine the signal which is fed back to the base electrode 11 to cause oscillations.

Bias is applied to the collector electrode from the source terminal 21 through the inductive portion of a three-pole band pass filter 51 at the collector. The inductor is part of a tuned output bandpass filter circuit 51 which is tuned at the third harmonic of the fundamental oscillator frequency. The transistor is biased such that with the crystal connected between the base and ground and oscillating, it operates in a class C condition. Since the transistor 10 is operated in class C, its conduction angle is adjusted, by proper dimensioning of the feedback capacitors 39, 41 and 37 and D.C. bias, for maximum output at the third harmonic of the frequency at the output of band pass filter 51.

The frequency determining circuit includes a crystal 50 in series with the parallel capacitances provided by fixed capacitors 54, variable capacitor 55 and varactor diode 56. The crystal 50 is connected in series with these parallel capacitances between the base 11 and ground or reference potential. The frequency determining circuit of the crystal 50 and the capacitors 54 and 55 and diode 56 are coupled across the voltage dividing capacitors 39, 41 and 37 when the oscillator is switched into operation.

The crystal 50 is operated in an anti-resonant or parallel resonant mode so that it presents an effective inductance at the frequency of oscillation. The crystal 50 is selected to have a series resonant frequency relatively widely spaced from this anti-resonant frequency so that a relatively large change in frequency is possible to obtain relatively large deviation in the oscillator frequency. Capacitors 54 and 55 are coupled in parallel across the variable capacitance diode 56. The variable capacitance diode bias is provided via voltage dividing resistors 65 and 66, or alternatively by the two arms of a temperature compensation network, and resistor 64. Point 68 at the junction of resistors 65 and 66 is coupled to a reference DC bias source, resistor 66 is coupled to the regulated source at terminal 21, and resistor 65 is coupled to the junction of resistors 66 and 64 at point 68 at one terminal end and at the opposite terminal end to ground or reference potential. Resistor 64 is an isolation resistor to isolate the RF at point 70 from the temperature compensation network at point 68. Modulating signals at teminal 59 are applied through capacitor 60 and either a resistor 61 or an inductor 67 across the voltage-variable capacitance diode 56 and the parallel capacitances 54 and 55. Capacitor 60 with resistor 61 (or inductor 67) is adapted to pass frequencies to point 70 between 10 Hz to 30 kHz.

The voltage variable capacitance diode 56 in combination with the capacitors 54 and 55 form an equivalent capacitance ($C_s$) or $$C_S = C_{54} + C_{55} + C_d$$

where $C_{54}$ = the value of capacitor 54.

$C_{55}$ = the value of capacitor 55.

$C_d$ = the value of the variable capacitance diode 56. This equivalent capacitance $C_s$ cooperates with the value of the voltage divider capacitors 39, 41 and 37 to form a resonant circuit with crystal 50 at the parallel resonant frequency of the crystal. The total capacitance between transistor base and ground is referred to as oscillator input capacitance and is approximated by the following equation:

$$C_{IN} = \frac{(C_{39} + C_{41} + C_{BE}) \times C_{37}}{(C_{39} + C_{41} + C_{BE} + C_{37})}$$

where $C_{IN}$ = imaginary part of the base to ground impedance in pF (picofarads).
$C_{39}$ = the value of capacitor 39 in pF.
$C_{41}$ = the value of capacitor 41 in pF.
$C_{37}$ = the value of capacitor 37 in pF.
$C_{BE}$ = the effective base-emitter capacitance in pF.
$C_{IN}$ may be for example on the order of 45 pF.

The change in the capacitance of the voltage variable capacitor 56 produces a change in the equivalent load capacitance which is applied to the crystal to change its frequency. The crystal may be designed to work with a given load capacitance. A change in the equivalent load capacitance will change the frequency of the oscillation of the crystal.

Figure 3:
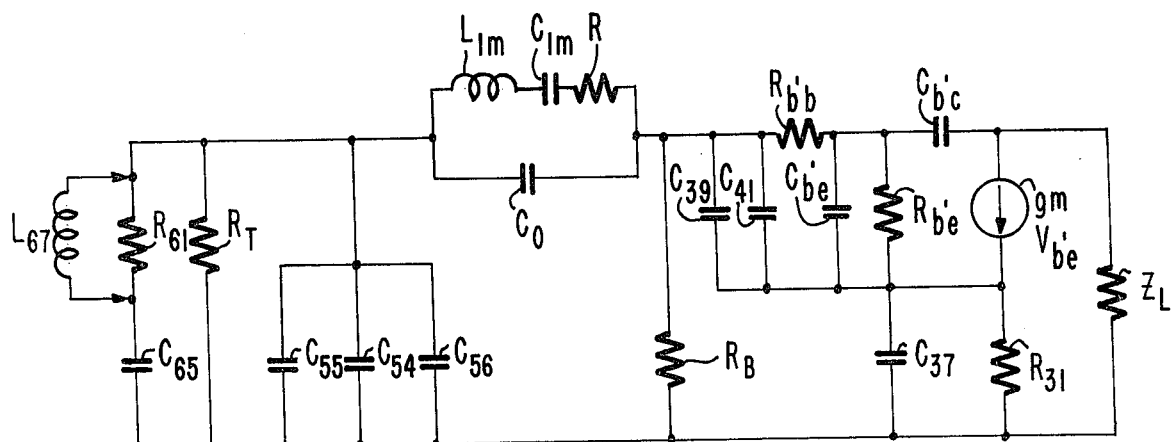
FIG. 3 is an equivalent circuit of the oscillator portion of FIG. 2.

The equivalent A.C. circuit of the oscillator portion of FIG. 2 diagram is illustrated in FIG. 3. It consists of:
1. The crystal motional parameters $L_{1_m}$, $C_{1_m}$, R and $C_0$.
2. The equivalent hybrid parameters of the transistor 10: $R_{b'b}$, $R_{b'e}$, $C_{b'e}$, $C_{b'c}$, and the current source gm $V_{b'e}$.
3. The capacitors $C_{37}$, $C_{41}$, $C_{39}$, $C_{55}$, $C_{54}$, $C_{56}$.
4. The equivalent resistance $R_B$ of the base D.C. bias network, where $$R_B = \frac{(R_{17} + R_{19}) R_{18}}{R_{17} + R_{18} + R_{19}}$$

where $R_{17}$, $R_{18}$ and $R_{19}$ are the respective values of resistors 17, 18 and 19.
5. The modulation coupling network $R_{61}C_{60}$ or $L_{67}C_{60}$, where $R_{61}$ and $L_{67}$ is the value of resistor 61 and inductor 67, and $C_{60}$ is the value of capacitor 60.
6. The equivalent resistance of the varicap D.C. bias network $R_T$, where $$R_T = R_{64} + \frac{R_{66} \times R_{65}}{R_{66} + R_{65}}$$

and $R_{64}$ is the value of resistor 64, $R_{65}$ is the value of resistor 65 and $R_{66}$ is the value of resistor 66.

Figure 4:
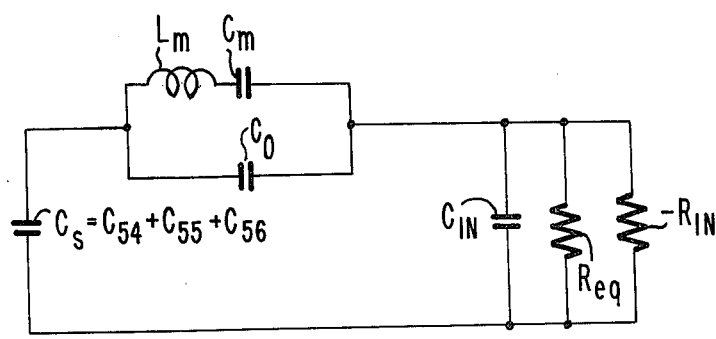
FIG. 4 is a simplified equivalent circuit of FIG. 2.

If it is assumed that the impedance of $R_{61}C_{60}$ in parallel with $R_T$ is much larger than the reactance of the parallel capacitance $C_{54} + C_{55} + C_{56}$ and if the losses of the feedback loop are lumped in the reactance "Req," the complex circuit of FIG. 3 can be approximated by the circuit of FIG. 4. When the input impedance between the transistor base and ground presents a negative resistance $-R_{IN}$ of the magnitude necessary to start the oscillation and furnish the desired amount of power to the load the oscillating circuit is reduced to the crystal and the two capacitors $C_{IN}$ and $C_S$ in series with each other. Referring to FIG. 4 and defining as crystal load capacitance $C_L$ the capacitance seen by the crystal across its terminal then one can write:

$$\frac{1}{C_L} = \frac{1}{C_S} + \frac{1}{C_{IN}} \text{ and } C_T = C_O + C_L$$

where:
$C_L$ = crystal load capacitance, farad
$C_{IN}$ = the equivalent reactance of the imaginary part of the transistor input impedance $Z_{IN}$.
$L_m$ = crystal motional inductance (henry)
$C_m$ = crystal motional capacitance (farad)
$C_0$ = crystal shunt capacitance (farad)
$C_S$ = the sum of capacitances $C_{54}$, $C_{55}$ and $C_{56}$ (farad)
$C_T$ = the total capacitance in parallel with the crystal $L_m$, $C_m$ branch, (farad)

Defining the crystal series resonance $F_S$ as the frequency at which the crystal series branch $L_m$, $C_m$ would oscillate the crystal parallel or anti-resonant frequency $F_P$ as the frequency of oscillation of the motional inductance $L_m$ with the series combination of $C_m$ and the total capacitance $C_T$ seen by the crystal the following equations can be written:

$$F_S = (2\pi \sqrt{L_m C_m})^{-1} \text{ in Hz} \quad (1)$$

$$F_S = \left(2\pi \sqrt{L_m C_m}\right)^{-1} \text{ in Hz} \quad (1)$$

$$F_P = \left[2\pi \sqrt{L_m \left(\frac{C_m C_T}{C_m + C_T}\right)}\right]^{-1} \text{ in Hz} \quad (2)$$

$$F_P = \left[F_S^2\left(1 + \frac{C_m}{C_T}\right)\right]^{\frac{1}{2}} \text{ in Hz} \quad (3)$$

$$\Delta F = F_p - F_S = F_S C_m / 2 \, C_T \text{ in Hz} \quad (4)$$

The frequency deviation $\Delta F$ of the oscillator, the equivalent circuit of which is illustrated in FIG. 4, can be shown to be:

$$\Delta F = F_S \frac{C_m (C_{IN} + C_S)}{2 (C_O C_{IN} + C_O C_S + C_{IN} C_S)} \quad (5)$$

or, normalizing with respect the crystal series resonance frequency $F_S$, to:

$$\frac{\Delta F}{F_S} = \frac{C_m (C_{IN} + C_S)}{2 (C_O C_{IN} + C_O C_S + C_{IN} C_S)} \quad (6)$$

Mobile radio with standard maximum frequency deviation of 5 kHz are at present subdivided in the three main frequency ranges of low VHF band (25 to 50 MHz), high VHF band (132 to 174 MHz) and UHF band (400 to 512 MHz). In the worst case (at the lowest frequency of each UHF/VHF band), the frequency excursion in PPM (parts per million) required at the output frequency is ± 200 PPM for the low VHF band, ± 37.87 PPM for the high VHF band, and ± 12.5 PPM for the UHF band.

The frequency deviation sensitivity S is defined herein as:

$$S = \frac{\frac{\Delta F}{F_C}}{V_{D_i}} \quad (7)$$

where:
S = frequency deviation sensitivity in PPM/Volt
$\Delta F$ = oscillator frequency deviation in Hz
$F_C$ = output carrier frequency in MHz
$V_{D_i}$ = instantaneous varicap voltage in volts If the maximum available peak amplitude of the modulating signal is known, the required minimum sensitivity can be calculated. For mobile radio application, where the available regulated power supply is around 9.5 volts D.C. typical magnitude of the available undistorted modulating audio signal is around 2.2 $V_{RMS}$ or ± 3.1V peak; therefore, the minimum frequency deviation sensitivity that can be used is 65 PPM/Volt for the low VHF band, 12.5 PPM/Volt for the high VHF band and 4 PPM/Volt for the UHF band. However, when simultaneously, the varicap is also used as variable capacitance to temperature compensate the crystal drift, a compromise sensitivity should be chosen depending on the realizability of the compensating voltage generator network for a given sensitivity.

It was found that at high VHF and UHF frequencies the optimum sensitivity is around 20 PPM/Volt and at low VHF around 70 PPM/Volt. This is realizable for the present available commercial diodes used. Future new diodes or different diodes from the ones used might require different optimum sensitivities. From equation (6), solving for $C_S$ and with $\Delta F/F_S = \phi$ $$C_S = \frac{C_{IN}(C_m - 2 C_0 \phi)}{2\phi(C_O + C_{IN}) - C_m} \tag{8}$$

Ideally if $C_S$ is matched by the varicap capacitance-/voltage characteristic at any instantaneous frequency deviation point, the only capacitance required to make $C_S$ is the varicap capacitance $C_{56}$. In practice, varicaps that match exactly the required value of $C_S$ for a constant rate of increase of $\Delta F/F_S$ versus the instantaneous magnitude of the modulating signal are at presently not available commercially. Even if they were available reasonable production tolerances of the crystal motional capacitance $C_m$ and of the capacitors and active device that make up the capacitance $C_{IN}$ would dictate a special matched varicap with unique variable capacity diode ($C_{56}$) versus voltage characteristic for each combination of crystals and component tolerances. This is clearly impractical and it is the purpose and embodiment of this invention to describe a practical method that synthesizes the required $C_S$ or a close approximation of it for a relatively broad range of frequency deviation sensitivities and reasonably practical crystal and other component tolerances.

The synthesis procedure is carried out for the high VHF and UHF requirements of 20 PPM/Volt sensitivity, the varicap D.C. reference voltage $V_{D_{REF}}$ of 6V and typical motional and load capacitance of 0.03 and 25 pF respectively. It can be shown that similar results are obtained for different sensitivities and crystal motional and/or load capacitances, the only difference being the degree of linearization achieved from a given excursion range of the D.C. varicap bias voltage.

Figure 6:
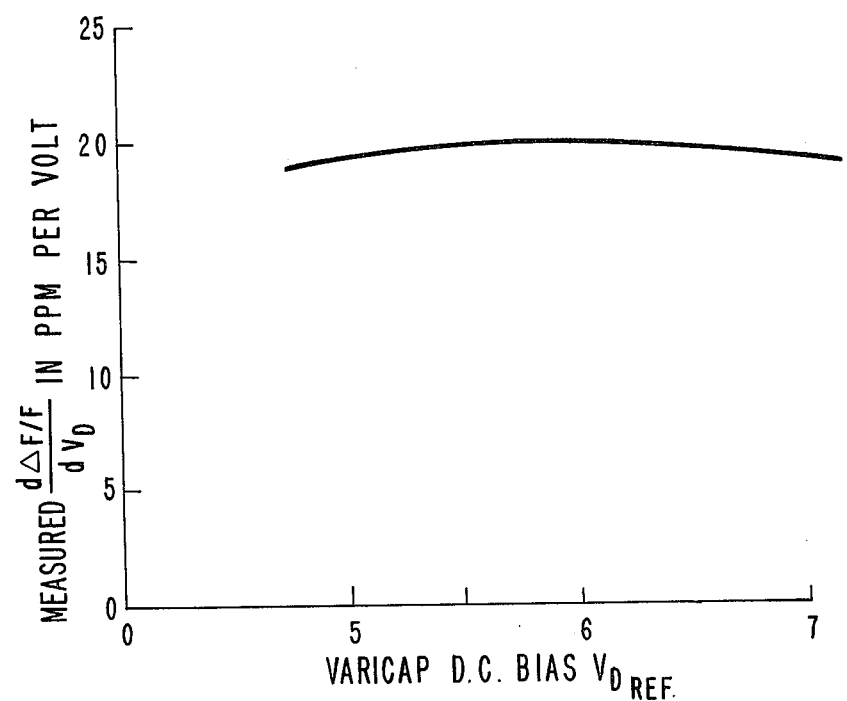
FIG. 6 is a plot of varicap D.C. bias versus measured sensitivity in PPM per volt.
Figure 5:
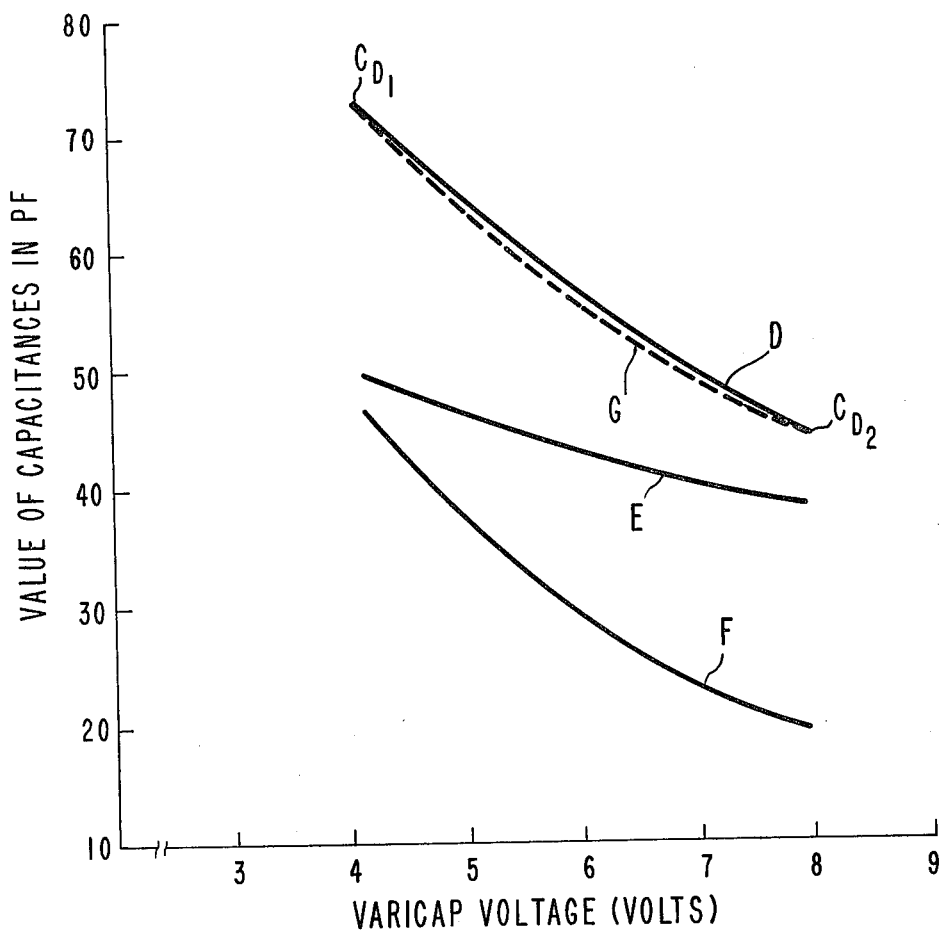
FIG. 5 is a plot of varicap D.C. bias versus value of capacitance.

In FIG. 5, curve D illustrates the required capacitance versus voltage varicap characteristic if it alone is to constitute the capacitance $C_S$ of FIG. 4. Curve E depicts the capacitance versus voltage characteristic of a typical abrupt junction varicap and curve F depicts the capacitance versus voltage characteristic of a hyperabrupt junction diode. It was found that two conditions should be met apriori for the desired approximation of curve D of FIG. 5. First, at any value of the varicap voltage the capacitance $C_{56}$ should never exceed the lowest possible value of $C_S$ within the design range of variability of $C_{IN}$, $V_{D_{REF}}$, $C_m$, $C_0$ and S. Second, at any value of the varicap voltage the slope of the varicap capacitance versus voltage characteristic should be steeper or equal to the steepest possible slope of curve D of FIG. 5 within the design range of variability of $C_{IN}$, $C_m$, $C_0$, $V_{D_{REF}}$ and S. As can be seen in FIG. 5, only the hyperabrupt junction diode meets this condition when trying to match curve D. When these two conditions are met by either choosing the commercial diode that approximates the requirement above for a given design set of $C_{IN}$, $C_m$, $C_0$, $V_{D_{REF}}$ and S, or by matching closely the design set of $C_{IN}$, $C_m$, $C_0$, S and $V_{D_{REF}}$ to an available commercial diode, the following equations give the values of the capacitance $C_p$, that is the sum of $C_{54}$ and $C_{55}$ in parallel to the varicap diode, and $C_{IN}$, the imaginary parts of the input impedance required:

$$C_p = \frac{-(AC - 2\phi_2 B - DF + 2\phi_1 E) + [(AC - 2\phi_2 B - DF + 2\phi_1 E)^2 - 4(2\phi_1 F - 2\phi_2 A)(BC - DE)]^{\frac{1}{2}}}{2(2\phi_1 F - 2\phi_2 A)} \tag{9}$$

$$\text{and } C_{IN} = \frac{A(C_{D_1} + C_p)}{C_m - 2\phi_1(C_O + C_{D_1} + C_p)} \tag{10}$$

where A, B, C, D, E, and F are intermediate calculation parameters and have the value given by the following equations:

$$A = 2\phi_1 C_0 - C_m;\ B = C_{D_1} A;\ C = C_m - 2 C_0 \phi_2 - 2\phi_2$$
$$C_{D_2};\ D = C_m - 2\phi_1 (C_0 + C_{D_1});\ E = C_{D_2}(2\phi_2$$
$$C_0 - C_m);\ F = 2\phi_2 C_0 - C_m;$$

and where $C_{D_1}$ and $C_{D_2}$ are the varicap capacitances at the two extreme voltages where the curves are to be matched perfectly and $\phi_1$ and $\phi_2$ the correspondent $\Delta F/F_S$, with $\Delta F$ and $F_S$ in hertz and all the capacitances in pF. To match curve D in FIG. 5 as close as possible using a hyperabrupt junction diode having curve F, the calculations using the equations (9) and (10) give a value for $C_p = 25.548$ and $C_{IN} = 45$ pF, where $C_m = 0.03$ pF, $C_0 = 7$ pF, $S = 20$ PPM/V, $C_L = 25$ pF and $V_{REF} = 6$ volts. This hyperabrupt junction diode is a KSW Electronics, Inc. of Burlington, Mass., type No. KV2202. With the above values of $C_p$ and $C_{IN}$, there is provided the dashed curve G in FIG. 5. FIG. 6 illustrates the measured slope of the normalized frequency deviation produced by a modulating signal of ± 2 Vpp (1.414 $V_{RMS}$) with respect to the variation of the varicap D.C. bias. Though the characteristic shown is only a good approximation of the ideal straight line required, it is clear that it possesses the important propriety required in modulators for mobile radio applications of never exceeding the maximum slope set at $V_{D_{REF}}$, should the varicap D.C. bias be varied for the purpose of temperature compensation. In this particular example the frequency deviation after being multiplied to the VHF frequency of 125 MHz is approximately 5000 Hz at 6V, 4950 Hz at 6 ± 0.5V, and 4800 Hz at 6 ± 1V.

This method of linearization makes possible and practical the use of a varicap in the simultaneous function of direct frequency modulator and as control element of the temperature compensation network. Also, because the slope of the frequency deviation is symmetrical with respect to the fixed reference voltage and close to a straight line, very low distortion of audio signals is achieved. Typical values are 0.5% at room temperature and under 1% within the temperature range of −40° to +80° C. The values are for an audio signal of 1 kHz and 3 kHz deviation at VHF and UHF frequencies of 132 to 512 MHz.

Figure 7:
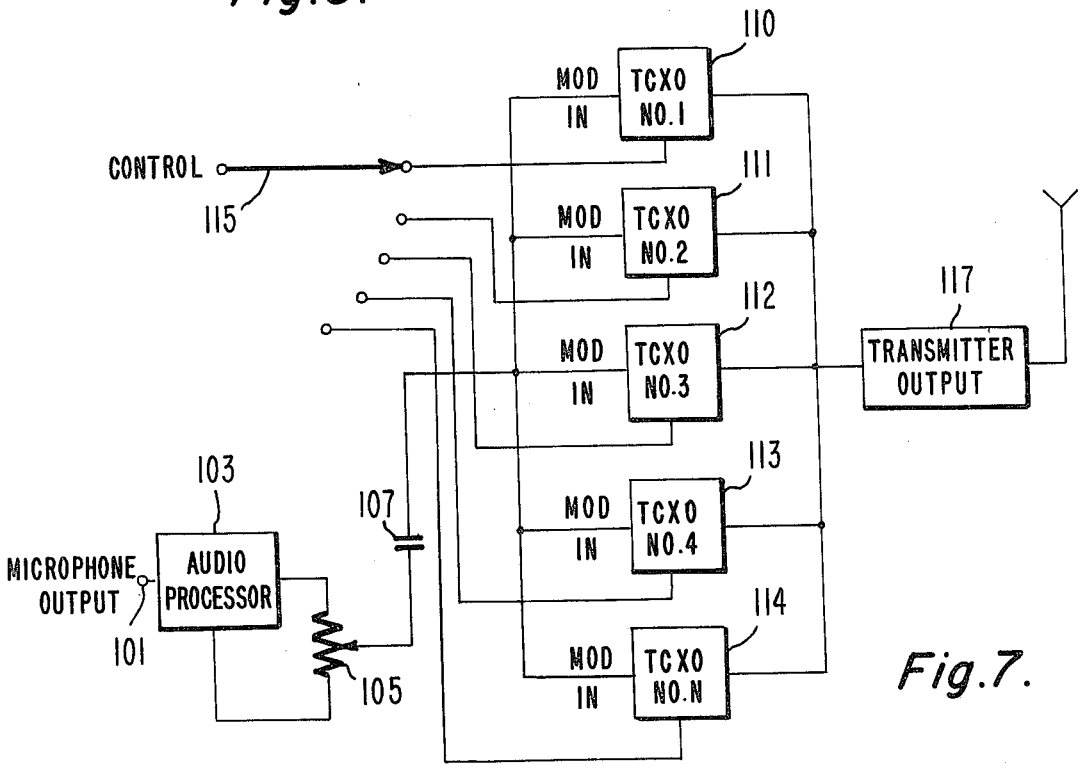
FIG. 7 is a block diagram of a multifrequency system using a plurality of oscillators like that in FIG. 2.

Since equations (9) and (10) show that $C_p$ and $C_{IN}$ can be synthesized for various values of S via $\phi_1$ and $\phi_2$ dimensioning, the adjustment of the variable portion of $C_p$ is also an exact method of setting the desired varicap modulation sensitivity S. This process is called modulation sensitivity equalization and unlike prior art multi-frequency TCXO's equalization schemes where each modulation voltage is separately adjusted to account for variance in individual oscillator frequency deviation sensitivity, the new equalization circuit internal to the TCXO, permits the elimination of all but one of the adjusting potentiometers as illustrated in FIG. 7. The microphone output at terminal 101 is coupled through the audio processor 103 to potentiometer 105. The tapped output from potentiometer 105 is coupled via capacitor 107 to each of the temperature compensated crystal oscillators 110 through 114 which are each like that described above in connection with FIG. 2. The position of control arm 115 determines which of the oscillators 110 through 114 channel switch is closed to thereby determine which of the oscillator outputs is provided to the transmitter output 117. Capacitor 107 is a D.C. blocking capacitor and resistor 105 is adjusted to provide a selected maximum amplitude of the modulating voltage for determining the maximum frequency deviation in all of the oscillators 110 through 114. The equalization of frequency deviation sensitivity is achieved by adjusting finely the capacitance across the varicap.

The oscillator described herein is further described in connection with application Ser. No. 790,865 filed Apr. 26, 1977 of Bortolo Mario Pradal. A temperature compensation network for use herewith is described in application Ser. No. 741,405 filed Nov. 12, 1976. The inventor is Bortolo Mario Pradal.

What is claimed is:

1. In a frequency modulated crystal control oscillator including a current conducting device for providing amplification to sustain oscillations and a frequency determining circuit connected to said current conducting device for controlling the frequency of oscillation, said frequency determining circuit including a crystal element resonant at a frequency dependent upon a reactance connected in series therewith, the improvement for improving the linearity of the modulation of the oscillator, comprising:

a voltage variable capacitance connected in series with said crystal element;

a second capacitance coupled across the series combination of said crystal element and said voltage variable capacitance; a third capacitance connected across said voltage variable capacitance; said crystal element, said voltage variable capacitance, said second capacitance and said third capacitance forming a parallel resonant circuit at the fundamental frequency of said oscillator;

means for applying an initial D.C. reference bias across said voltage variable capacitance to set the center frequency of oscillation;

means for applying a modulating voltage across said voltage variable capacitance to change the capacitive reactance thereof to thereby change the frequency of operation of said crystal element and modulate the frequency of oscillations; and said second and third capacitances having selected capacitance values to provide a frequency deviation vs. voltage that is generally symmetrical about the initial D.C. reference bias.

2. The combination of claim 1, wherein said second and third capacitances have selected capacitive values to provide a frequency deviation that is maximum at said D.C. reference bias.

3. The combination of claim 1, wherein the value of said third capacitance is selected to control the sensitivity of the modulator.

4. The combination of claim 1, wherein said current conducting device is a transistor.

5. The combination of claim 1, wherein said third capacitance includes a variable capacitor coupled across said voltage variable capacitor for adjusting the center frequency of oscillation.

6. The combination of claim 1, wherein said third capacitance is provided by the parallel combination of a fixed capacitor and variable capacitor.

7. The combination of claim 1, wherein said voltage variable capacitor is a hyperabrupt junction diode.

* * * * *